(12) United States Patent
Zhang et al.

(10) Patent No.: US 11,927,549 B2
(45) Date of Patent: Mar. 12, 2024

(54) SHIELDING STRATEGY FOR MITIGATION OF STRAY FIELD FOR PERMANENT MAGNET ARRAY

(71) Applicant: KLA Corporation, Milpitas, CA (US)

(72) Inventors: Qian Zhang, San Jose, CA (US); Wayne Chiwoei Lo, Campbell, CA (US); Joseph Maurino, Milpitas, CA (US); Tomas Plettner, Milpitas, CA (US)

(73) Assignee: KLA CORPORATION, Milpitas, CA (US)

( * ) Notice: Subject to any disclaimer, the term of this patent is extended or adjusted under 35 U.S.C. 154(b) by 364 days.

(21) Appl. No.: 17/470,183

(22) Filed: Sep. 9, 2021

(65) Prior Publication Data

US 2023/0076175 A1   Mar. 9, 2023

(51) Int. Cl.
 *G01N 23/20* (2018.01)
 *G01N 23/20008* (2018.01)
 (Continued)

(52) U.S. Cl.
 CPC ..... *G01N 23/20008* (2013.01); *H01F 7/0273* (2013.01); *H05K 9/0075* (2013.01);
 (Continued)

(58) Field of Classification Search
 CPC ....... G01N 23/20008; G01N 2223/052; G01N 2223/20; G01N 2223/30; H01F 7/0273; H05K 9/0075
 (Continued)

(56) References Cited

U.S. PATENT DOCUMENTS 5,744,910 A * 4/1998 Symons ................ H01J 23/087
                                                        315/5.35
8,698,094 B1   4/2014 Sears et al.
(Continued)

FOREIGN PATENT DOCUMENTS

KR    101744482 B1    6/2017
KR    101909649 B1    10/2018

OTHER PUBLICATIONS

WIPO, International Search Report for International Application No. PCT/US2022/042574, dated Dec. 20, 2022.
(Continued)

*Primary Examiner* — Nicole M Ippolito
(74) *Attorney, Agent, or Firm* — Hodgson Russ LLP

(57) ABSTRACT

The present disclosure provides an inspection system and a method of stray field mitigation. The system includes an array of electron beam columns, a first permanent magnet array, and a plurality of shielding plates. The array of electron beam columns each includes an electron source configured to emit electrons toward a stage. The first permanent magnet array is configured to condense the electrons from each electron source into an array of electron beams. The first permanent magnet array is arranged at a first end of the array of electron beam columns. The plurality of shielding plates extend across the array electron beam columns downstream of the first permanent magnet array in a direction of electron emission. The array of electron beams pass through a plurality of apertures in each of the plurality of shielding plates, which reduces stray magnetic field in a radial direction of the array of electron beams.

20 Claims, 12 Drawing Sheets

(51) Int. Cl.
*H01F 7/02* (2006.01)
*H05K 9/00* (2006.01)
(52) U.S. Cl.
CPC ... *G01N 2223/052* (2013.01); *G01N 2223/20* (2013.01); *G01N 2223/30* (2013.01)
(58) Field of Classification Search
USPC .................. 250/306, 307, 309, 310, 311
See application file for complete search history.

(56) References Cited

U.S. PATENT DOCUMENTS

| | | | |
|---|---|---|---|
| 2012/0145900 A1* | 6/2012 | Chen | G01N 23/2251 250/311 |
| 2013/0313431 A1 | 11/2013 | Tanaka et al. | |
| 2018/0240640 A1 | 8/2018 | Tahmassebpur | |

OTHER PUBLICATIONS

WIPO, Written Opinion of the International Searching Authority for International Application No. PCT/US2022/042574, dated Dec. 20, 2022.

Hawkes et al., "Magnetic Electron Lenses", Topics in Current Physics, 1982, pp. 1-474, Springer-Verlag.

* cited by examiner

SHIELDING STRATEGY FOR MITIGATION OF STRAY FIELD FOR PERMANENT MAGNET ARRAY

FIELD OF THE DISCLOSURE

This disclosure relates to inspection systems and, more particularly, to inspection systems utilizing an electron beam and permanent magnet array.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer or an EUV mask using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

One device used for inspection processes is a multi-column system. In a multi-column system, hundreds of beamlets are generated and focused onto a target. Each beamlet is directed through an optical column comprising upper and lower permanent magnets. However, the permanent magnets generate a stray field, which causes beam deflection. Beam deflection leads to poor beam alignment, and reduces the accuracy of the inspection process.

Therefore, what is needed is a method for mitigation of stray field in the multi-beam system.

BRIEF SUMMARY OF THE DISCLOSURE

An embodiment of the present disclosure provides an inspection system. The inspection system comprises an array of electron beam columns, each comprising an electron source configured to emit electrons toward a stage. The inspection system further comprises a first permanent magnet array configured to condense the electrons from each electron source into an array of electron beams. The first permanent magnet array is arranged at a first end of the array of electron beam columns. The inspection system further comprises a plurality of shielding plates extending across the array of electron beam columns downstream of the first permanent magnet array in a direction of electron emission. The plurality of shielding plates each comprise a plurality of apertures and have a thickness between 1 μm and 1 mm, and the array of electron beams pass through the plurality of apertures. The plurality of shielding plates reduce stray magnetic field in a radial direction of the array of electron beams.

According to an embodiment of the present disclosure, the inspection system may further comprise a second permanent magnet array configured to focus the array of electron beams toward a target on the stage. The second permanent magnet array is arranged at a second end of the array of electron beam columns.

According to an embodiment of the present disclosure, the plurality of shielding plates comprises a first shielding plate arranged proximate to the first permanent magnet array, and a second shielding plate arranged proximate to the second permanent magnet array.

According to an embodiment of the present disclosure, the inspection system further comprises a detector configured to detect electrons reflected from the target. The detector is arranged between the first permanent magnet array and the second permanent magnet array. The plurality of shielding plates further comprises a third shielding plate arranged proximate to the detector.

According to an embodiment of the present disclosure, the plurality of shielding plates further comprises a fourth shielding plate arranged proximate to the detector, opposite to the third shielding plate.

According to an embodiment of the present disclosure, the plurality of shielding plates further comprises at least one supplemental shielding plate arranged between the first shielding plate and the second shielding plate.

According to an embodiment of the present disclosure, the plurality of shielding plates comprises at least seven shielding plates.

According to an embodiment of the present disclosure, at least one of the plurality of shielding plates is arranged where the stray magnetic field is at a highest magnitude in the radial direction of the array of electron beams.

According to an embodiment of the present disclosure, the thickness of each of the plurality of shielding plates is at least 120 μm.

According to an embodiment of the present disclosure, the plurality of shielding plates are comprised of a magnetic nickel-iron alloy.

An embodiment of the present disclosure provides a method of stray field mitigation applied to a multi-column inspection system. The inspection system includes an array of electron beam columns, each electron beam column comprising an electron beam source configured to emit electrons toward a stage. The method comprises directing the electrons from each electron source through a first permanent magnet array to condense the electrons into an array of electron beams. The first permanent magnet array is arranged at a first end of the array of electron beam columns. The method further comprises directing the array of electron beams through a plurality of shielding plates extending across the array of electron beam columns downstream of the first permanent magnet array. The plurality of shielding plates each comprise a plurality of apertures and have a thickness between 1 μm and 1 mm, and the array of electron beams pass through the plurality of apertures. The plurality of shielding plates reduce stray magnetic field in a radial direction of the array of electron beams.

According to an embodiment of the present disclosure, the method further comprises directing the array of electron beams through a second permanent magnet array to focus the array of electron beams toward a target on the stage. The second permanent magnet array is arranged at a second end of the array of electron beam columns, downstream of the plurality of shielding plates.

According to an embodiment of the present disclosure, directing the array of electron beams through a plurality of shielding plates comprises directing the array of electron beams through a first shielding plate arranged proximate to the first permanent magnet array, and directing the array of electron beams through a second shielding plate arranged proximate to the second permanent magnet array.

According to an embodiment of the present disclosure, the method further comprises directing the array of electron beams through a detector configured to detect electrons reflected from the target. The detector is arranged between the first permanent magnet array and the second permanent magnet array. Directing the array of electron beams through a plurality of shielding plates further comprises directing the array of electron beams through a third shielding plate arranged proximate to the detector.

According to an embodiment of the present disclosure, directing the array of electron beams through a plurality of shielding plates further comprises directing the array of electron beams through a fourth shielding plate arranged proximate to the detector, opposite to the third shielding plate.

According to an embodiment of the present disclosure, directing the array of electron beams through a plurality of shielding plates further comprises directing the array of electron beams through at least one supplemental shielding plate arranged between the first shielding plate and the second shielding plate.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1A:
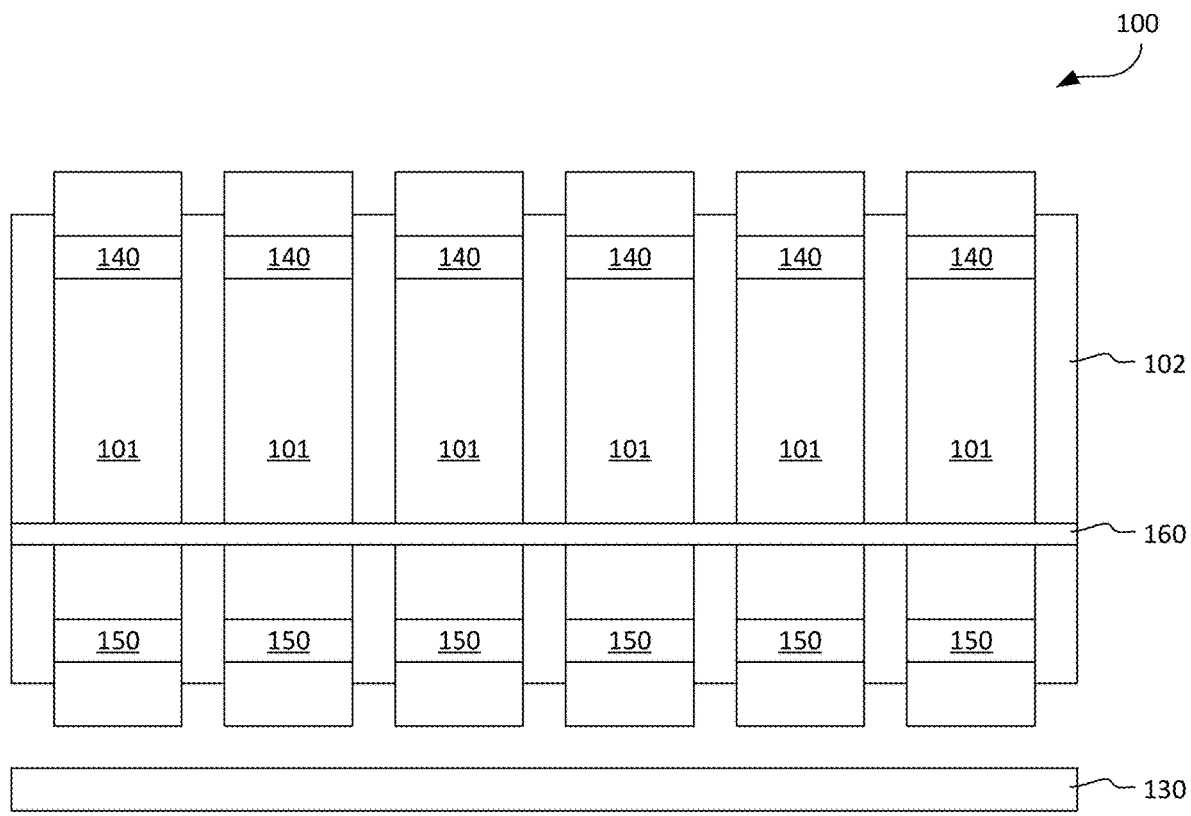
FIG. 1A is a schematic diagram of an inspection system of the present disclosure.

As shown in FIG. 1A, an embodiment of the present disclosure provides a multi-column inspection system 100. The inspection system 100 may include an array of electron beam columns 101. The array of electron beam columns 101 may be a two-dimensional array. While seven electron beam columns 101 are illustrated in FIG. 1A, the particular size and number of electron beam columns in the array 101 may vary, depending on the application. The electron beam columns in the array 101 also can extend into or out of the page. The electron beam columns 101 may be held by a support structure 102.

Figure 1B:
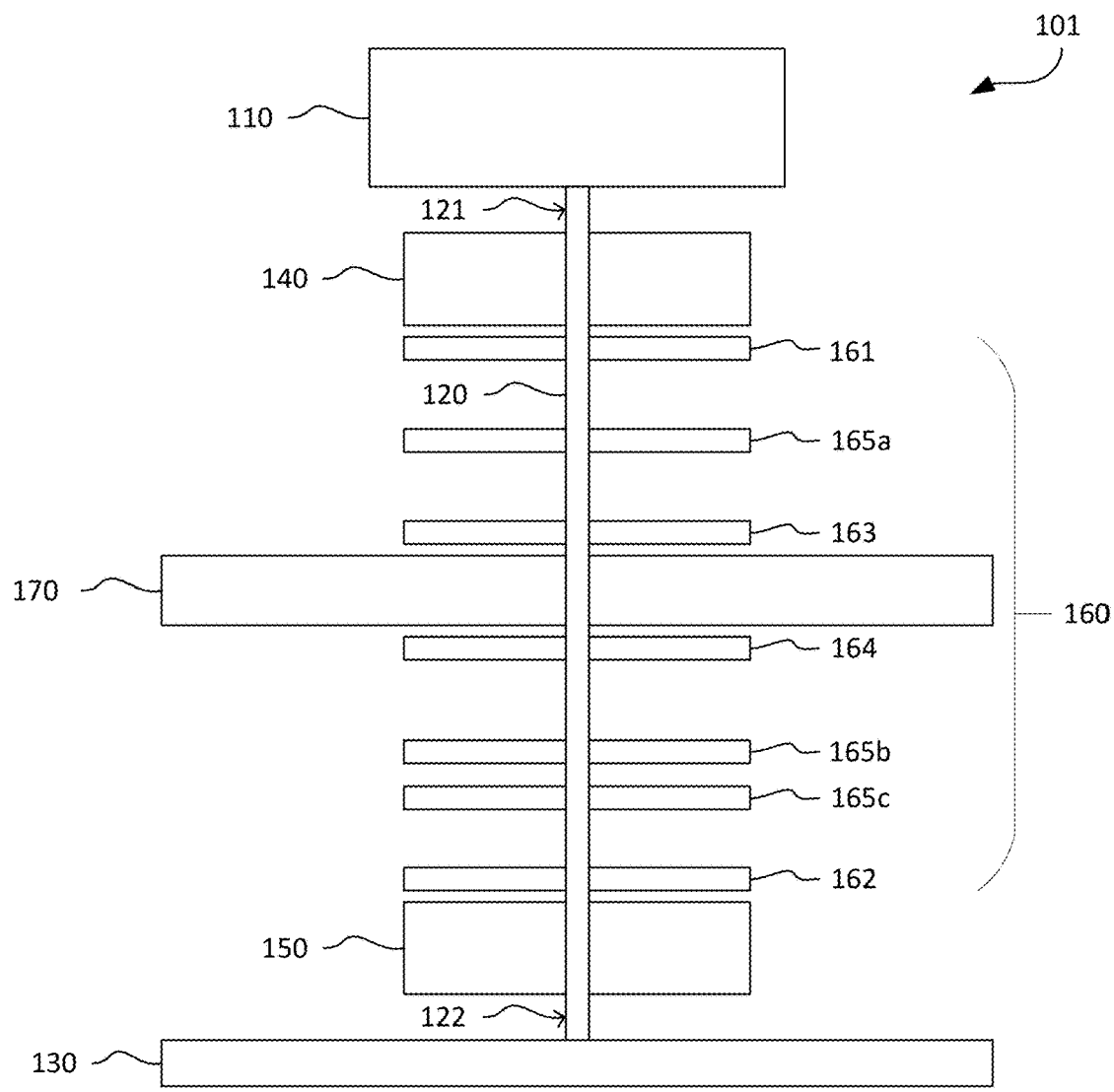
FIG. 1B is a schematic diagram of an electron beam column of the present disclosure.

As shown in FIG. 1B, each electron beam column 101 of the inspection system 100 may comprise an electron beam source 110. The electron beam source 110 may be configured to emit electrons in a single electron beam, or multiple electron beams arranged in an array. A single electron beam source 110 can be used for all the electron beam columns 101, each electron beam column 101 can have its own electron beam source 110, or some combination thereof. The electrons from each electron beam source 110 may be directed toward a stage 130. The stage 130 may be configured to hold a target, such as a semiconductor wafer, or a reticle.

The inspection system 100 may further comprise a first permanent magnet array 140. The first permanent magnet array 140 may be configured to condense the electrons from each electron source 110 into an array of electron beams 120. The first permanent magnet array 140 may be arranged at a first end 121 of the array of electron beam columns 101. For example, the first permanent magnet array 140 may be arranged at an upper end of the array of electron beam columns 101, proximate to the electron beam source 110.

The inspection system 100 may further comprise a second permanent magnet array 150. The second permanent magnet array 150 may be configured to focus the array of electron beams 120 toward the target. The second permanent magnet array 150 may be arranged at a second end 122 of the array of electron beam columns 101. For example, the second permanent magnet array 150 may be arranged at a lower end of the array of electron beam columns 101, proximate to the stage 130.

According to an embodiment of the present disclosure, the inspection system 100 may only include one permanent magnet array (e.g., the first permanent magnet array 140). According to another embodiment of the present disclosure, the inspection system 100 may include more than one permanent magnet array (e.g., the first permanent magnet array 140 and the second permanent magnet array 150).

According to an embodiment of the present disclosure, the support structure 102 may hold the permanent magnet array 140 and the second permanent magnet array 150.

According to an embodiment of the present disclosure, the inspection system 100 may comprise only one of the first permanent magnet array 140 and the second permanent magnet array 150.

Figure 1C:
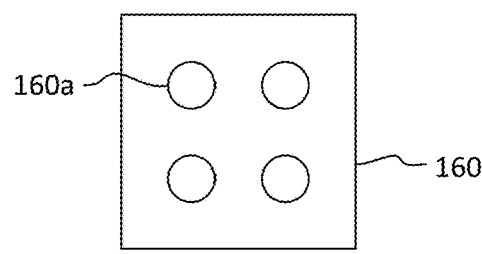
FIG. 1C is a top view of a shielding plate according to an embodiment of the present disclosure.
Figure 2A:
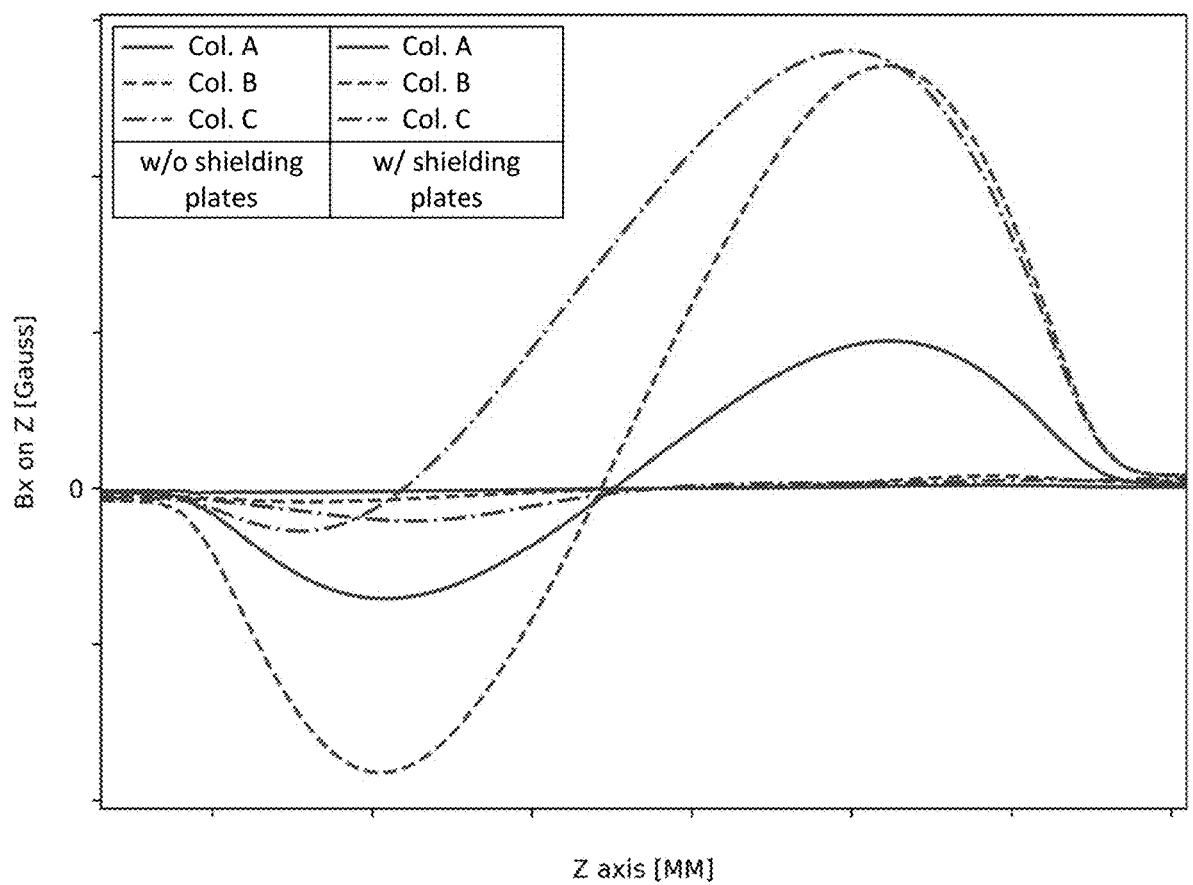
FIG. 2A is a graphical illustration of the reduction in the magnetic stray field $B_x$ according to an embodiment of the present disclosure.
Figure 2B:
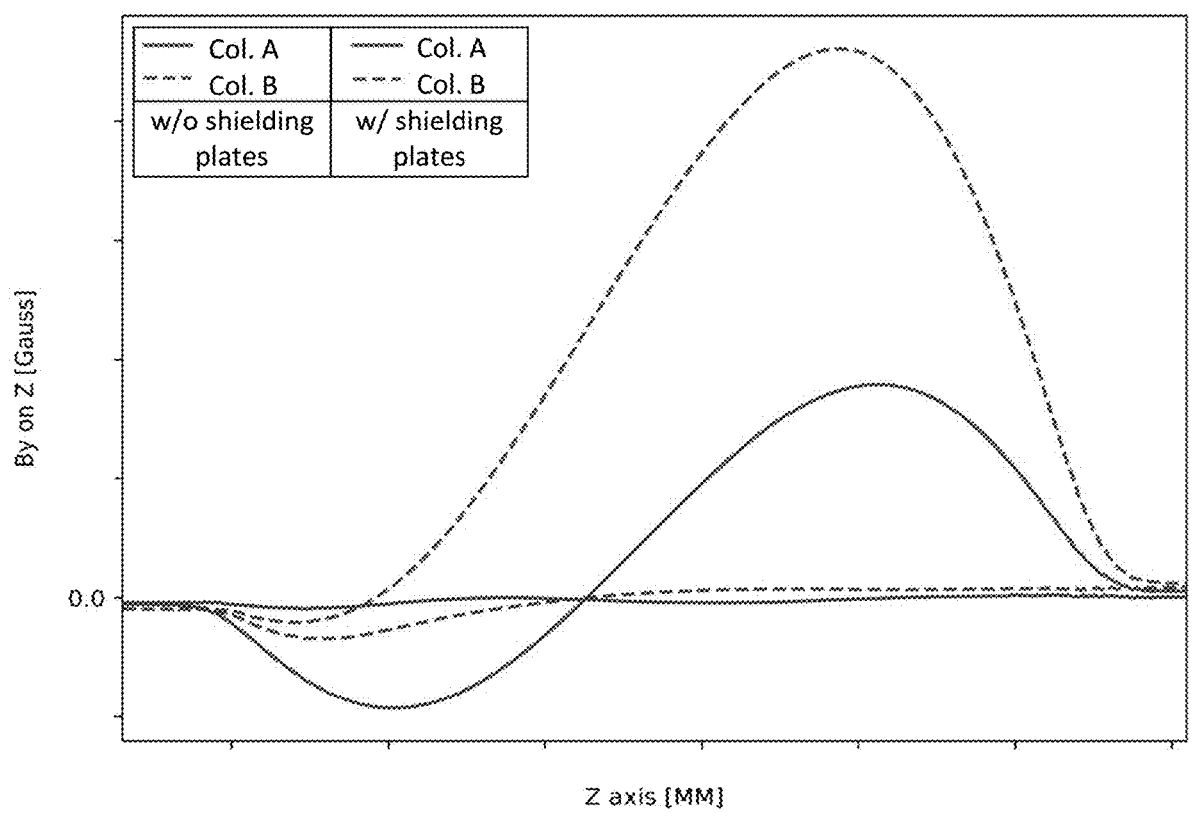
FIG. 2B is a graphical illustration of the reduction in the magnetic stray field $B_y$ according to an embodiment of the present disclosure.
Figure 2C:
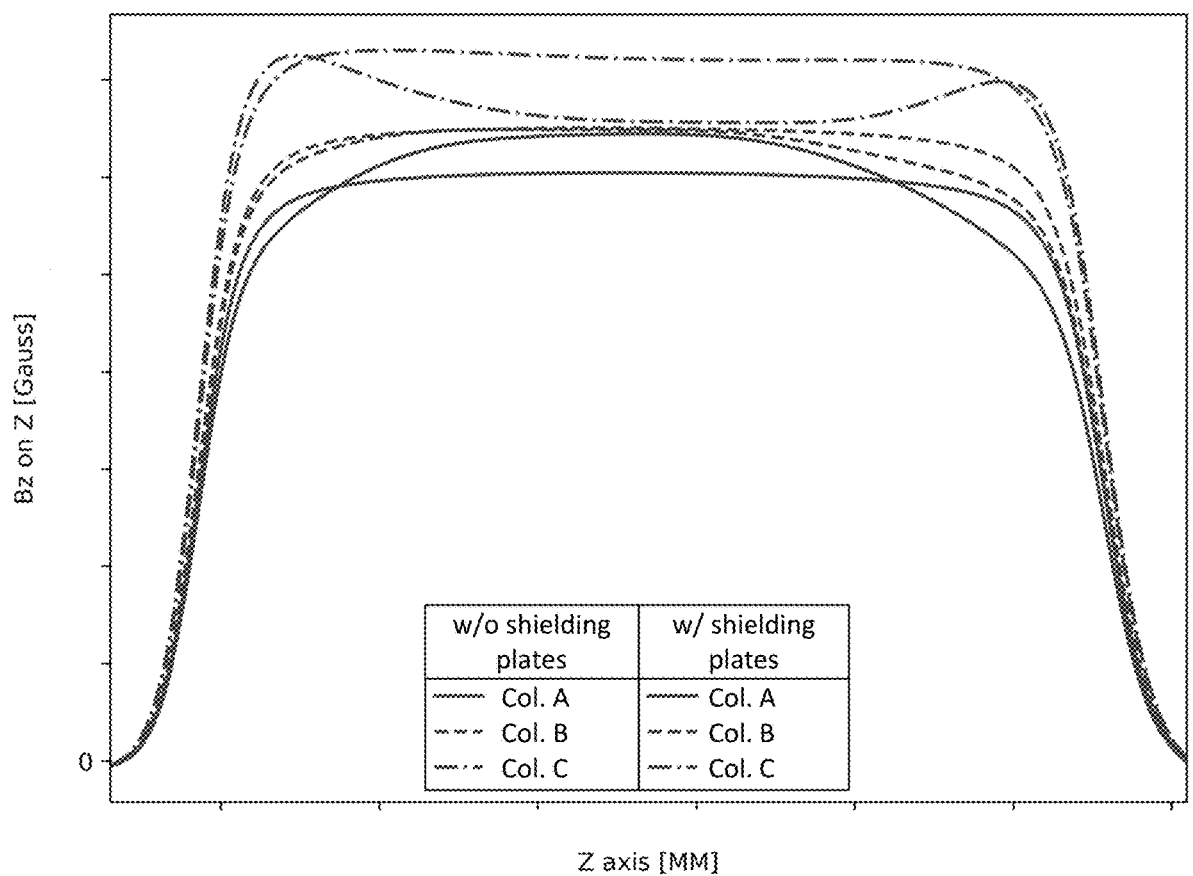
FIG. 2C is a graphical illustration of the impact on the magnetic field $B_z$ parallel to electron beam optical axis according to an embodiment of the present disclosure.

The inspection system 100 may further comprise a plurality of shielding plates 160. The plurality of shielding plates 160 may extend across the array of electron beam columns 101 between the first permanent magnet array 140 and the second permanent magnet array 150. While only one shielding plate 160 is illustrated in FIG. 1A (for ease of illustration), multiple shielding plates 160 may be provided between the first permanent magnet array 140 and the second permanent magnet array 150. As shown in FIG. 1C, the plurality of shielding plates 160 may each comprise a plurality of apertures 160a. Each aperture 160a may be circular, elliptical, or polygonal. The particular size and shape of each aperture 160a may depend on the position of the particular shielding plate 160 within each of the electron beam columns 101, the dimensions of the electron beam, and/or the size and shape of other components within the inspection system 100 adjacent to the particular shielding plate. The plurality of apertures 160a may be arranged in a regular pattern, corresponding to the X-Y arrangement of the array of electron beam columns 101. While a two-by-two arrangement of apertures 160a is illustrated in FIG. 2C, the number and arrangement of apertures 160a depends on the number and arrangement of electron beam columns in the array 101. The array of electron beams 120 may pass through the plurality of apertures 160a. In this way, the array of electron beams 120 may pass through each of the plurality of shielding plates 160 as the array of electron beams 120 travels through each electron beam column 101 toward the stage 130. Each shielding plate 160 may have a thickness between 1 µm and 1 mm. For example, each shielding plate 160 may have a thickness of at least 125 µm. In a particular embodiment, the thickness may be about 250 µm. The plurality of shielding plates 160 may have the same or different thickness. The plurality of shielding plates 160 may be comprised of a nickel-iron alloy. The nickel-iron alloy can be magnetic. For example, the plurality of shielding plates 160 may be comprised of Carpenter 49 or Carpenter HyMu "80" alloy. Other soft iron alloys may also be used.

According to an embodiment of the present disclosure, the support structure 102 may hold the plurality of shielding plates 160. The plurality of shielding plates 160 may be fixed to the various components within the array of electron beam columns 101. For example, the plurality of shielding plates 160 may include mounting holes configured to receive fasteners to secure the plurality of shielding plates 160 to the support structure 102 and/or components within the array of electron beam columns 101. The plurality of shielding plates 160 may be evenly spaced within the array of electron beam columns 101.

With the electron beam column 101 of the present disclosure, the plurality of shielding plates 160 may reduce stray magnetic field in a radial direction of the array of electron beams 120. For example, the axial direction of each electron beam column 101 may define the Z-axis, and the X-axis and Y-axis may be defined by the radial directions of each electron beam column 101. Correspondingly, the magnetic field in each electron beam column 101 may be defined by $B_x$, $B_y$, and $B_z$. The magnetic field $B_x$ and $B_y$ may be reduced to below 7%. Such reduction of magnetic field may result in reduced beam deflection, which improves beam alignment, ease the multi-column setup, and improves the accuracy of the inspection process.

According to an embodiment of the present disclosure, the plurality of shielding plates 160 may comprise a first shielding plate 161. The first shielding plate 161 may be arranged proximate to the first permanent magnet array 140. For example, the first shielding plate 161 may be arranged at the first end 121 of the array of electron beam columns 101, downstream of the first permanent magnet array 140.

According to an embodiment of the present disclosure, the plurality of shielding plates 160 may comprise a second shielding plate 162. The second shielding plate 162 may be arranged proximate to the second permanent magnet array 150. For example, the second shielding plate 162 may be arranged at the second end 122 of the array of electron beam columns 101, upstream of the second permanent magnet array 150.

According to an embodiment of the present disclosure, the electron beam column 101 may further comprise a detector 170. The detector 170 may be configured to detect electrons reflected from the target. The detector 170 may be arranged between the first permanent magnet array 140 and the second permanent magnet array 150.

According to an embodiment of the present disclosure, the plurality of shielding plates 160 may further comprise a third shielding plate 163. The third shielding plate 163 may be arranged proximate to the detector 170. For example, the third shielding plate 163 may be arranged upstream of the detector 170 or downstream of the detector 170.

According to an embodiment of the present disclosure, the plurality of shielding plates 160 may further comprise a fourth shielding plate 164. The fourth shielding plate 164 may be arranged proximate to the detector 170, opposite to the third shielding plate 163. For example, the third shielding plate 163 may be arranged upstream of the detector 170, and the fourth shielding plate 164 may be arranged downstream of the detector 170. Alternatively, the third shielding plate 163 may be arranged downstream of the detector 170, and the fourth shielding plate 164 may be arranged upstream of the detector 170. In both configurations, the third shielding plate 163 and the fourth shielding plate 164 may be arranged on opposite sides of the detector 170.

According to an embodiment of the present disclosure, the plurality of shielding plates 160 may further comprise at least one supplemental shielding plate 165. The at least one supplemental shielding plate 165 may be arranged between the first shielding plate 161 and the second shielding plate 162.

According to an embodiment of the present disclosure, the plurality of shielding plates 160 may comprise seven shielding plates. For example, as shown in FIG. 1B, the plurality of shielding plates 160 may comprise the first shielding plate 161, the second shielding plate 162, the third shielding plate 163, the fourth shielding plate 164, and three supplemental shielding plates 165. The first shielding plate 161 may be arranged proximate to the first permanent magnet array 140. The second shielding plate may be arranged proximate to the second permanent magnet array 150. The third shielding plate 163 and the fourth shielding plate 164 may be arranged proximate to, and on opposite sides of, the detector 170. A first supplemental shielding plate 165a may be arranged between the first shielding plate 161 and the third shielding plate 163. A second supplemental shielding plate 165b may be arranged between the fourth shielding plate 164 and the second shielding plate 162. A third supplemental shielding plate 165c may be arranged between the second supplemental shielding plate 165b and the second shielding plate 162. According to this design, stray magnetic field in the radial direction may be reduced by more than 92%. For example, FIG. 2A and FIG. 2B illustrate the stray magnetic field $B_x$ and $B_y$ of three columns A, B, C of the array of electron beam columns 101 with and without shielding plates 160. Similarly, FIG. 2C illustrates the magnetic field $B_z$ of three columns A, B, C of the array of electron beam columns 101 with and without shielding plates 160.

According to an embodiment of the present disclosure, the plurality of shielding plates 160 may comprise more than seven shielding plates. The particular number of shielding plates may depend on the available space within the array of electron beam columns 101. It can be appreciated that adding more shielding plates 160 to the inspection system 100 may further reduce the stray magnetic field.

Figure 3:
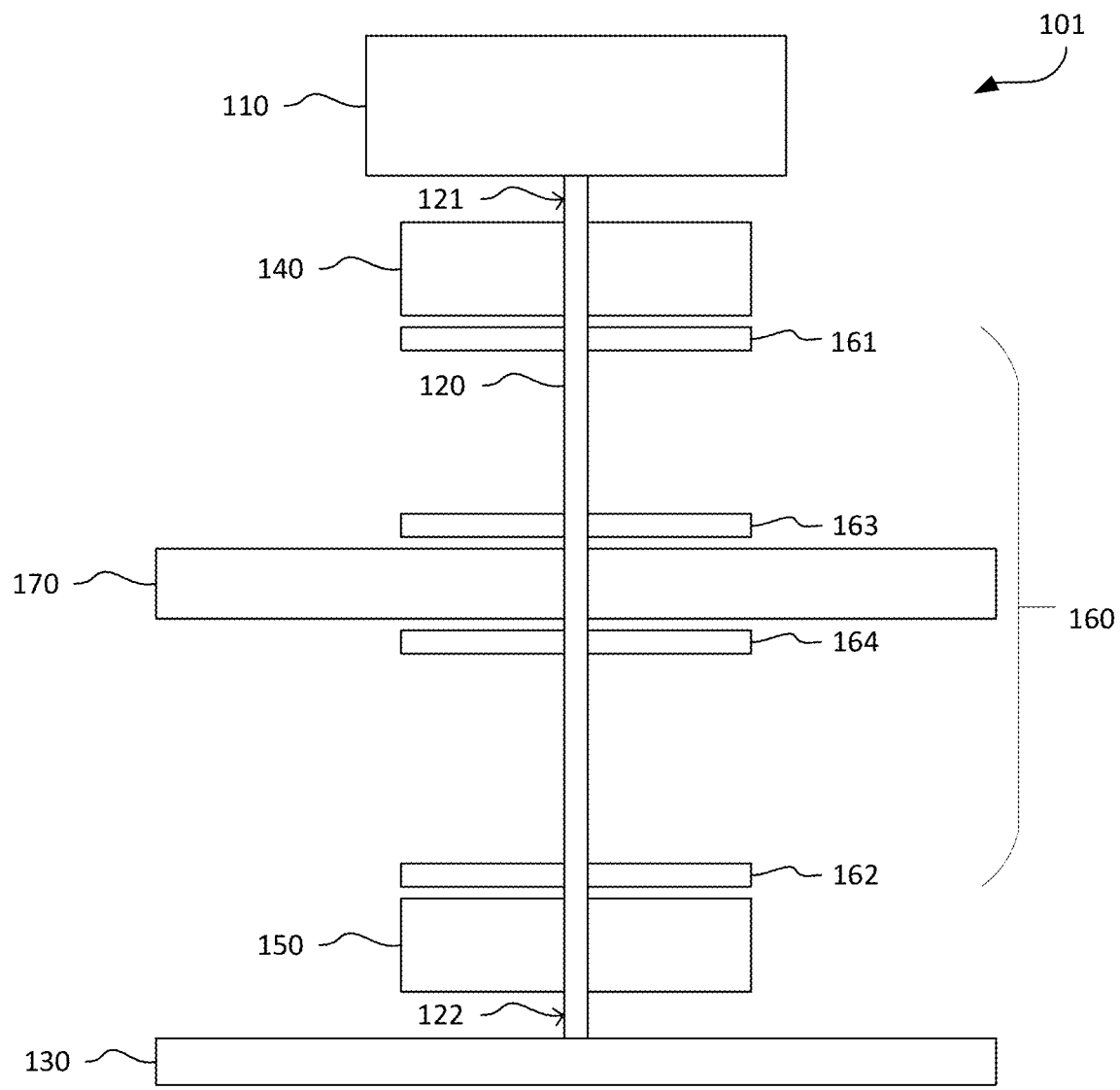
FIG. 3 is a schematic diagram of an electron beam column according to an embodiment of the present disclosure.

According to another embodiment of the present disclosure, the plurality of shielding plates 160 may comprise four shielding plates. For example, as shown in FIG. 3, the plurality of shielding plates may comprise the first shielding plate 161, the second shielding plate 162, the third shielding plate 163, and the fourth shielding plate 164. The first shielding plate 161 may be arranged proximate to the first permanent magnet array 140. The second shielding plate 162 may be arranged proximate to the second permanent magnet array 150. The third shielding plate 163 and the fourth shielding plate 164 may be arranged proximate to, and on opposite sides of, the detector 170. According to this design, stray magnetic field in the radial direction may be reduced by more than 90%.

Figure 4:
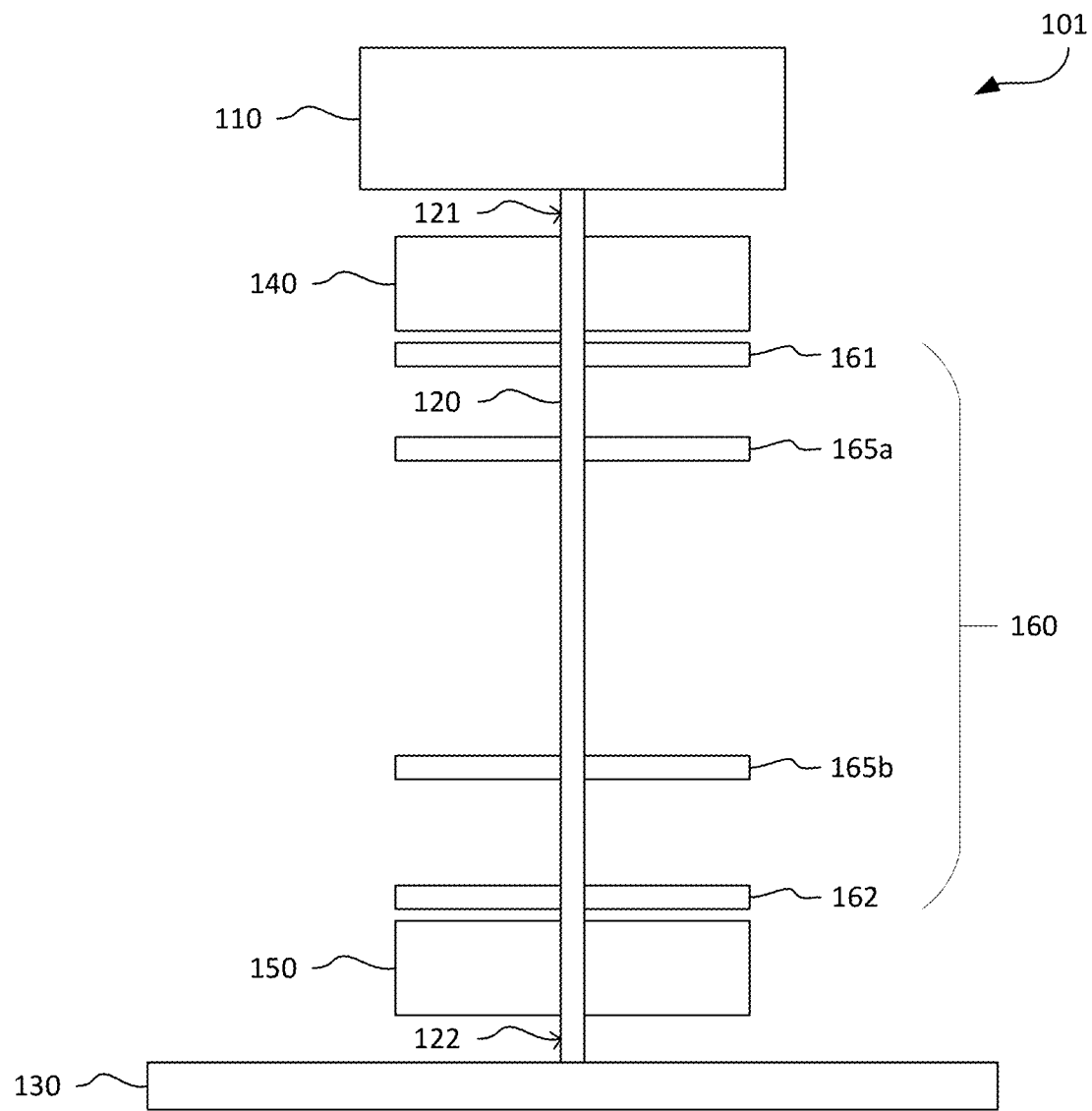
FIG. 4 is a schematic diagram of an electron beam column according to another embodiment of the present disclosure.

According to another embodiment of the present disclosure, the plurality of shielding plates 160 may comprise four shielding plates. For example, as shown in FIG. 4, the plurality of shielding plates may comprise the first shielding plate 161, the second shielding plate 162, a first supplemental shielding plate 165a, and a second supplemental shielding plate 165b. The first shielding plate 161 may be arranged proximate to the first permanent magnet array 140. The second shielding plate 162 may be arranged proximate to the second permanent magnet array 150. The first supplemental shielding plate 165a and the second supplemental shielding plate 165b may be arranged where the stray magnetic field is at a highest magnitude in the radial direction of the array of electron beams 101. For example, referring to FIGS. 2A and 2B, the first supplemental shielding plate 165a and the second supplemental shielding plate 165b may be arranged along the Z-axis where $B_x$ and $B_y$ are at a highest magnitude (positive or negative value). According to this design, stray magnetic field in the radial direction may be reduced by more than 75%. Various other optical components can be included between the first permanent magnet array 140 and the second permanent magnet array 150.

Figure 5:
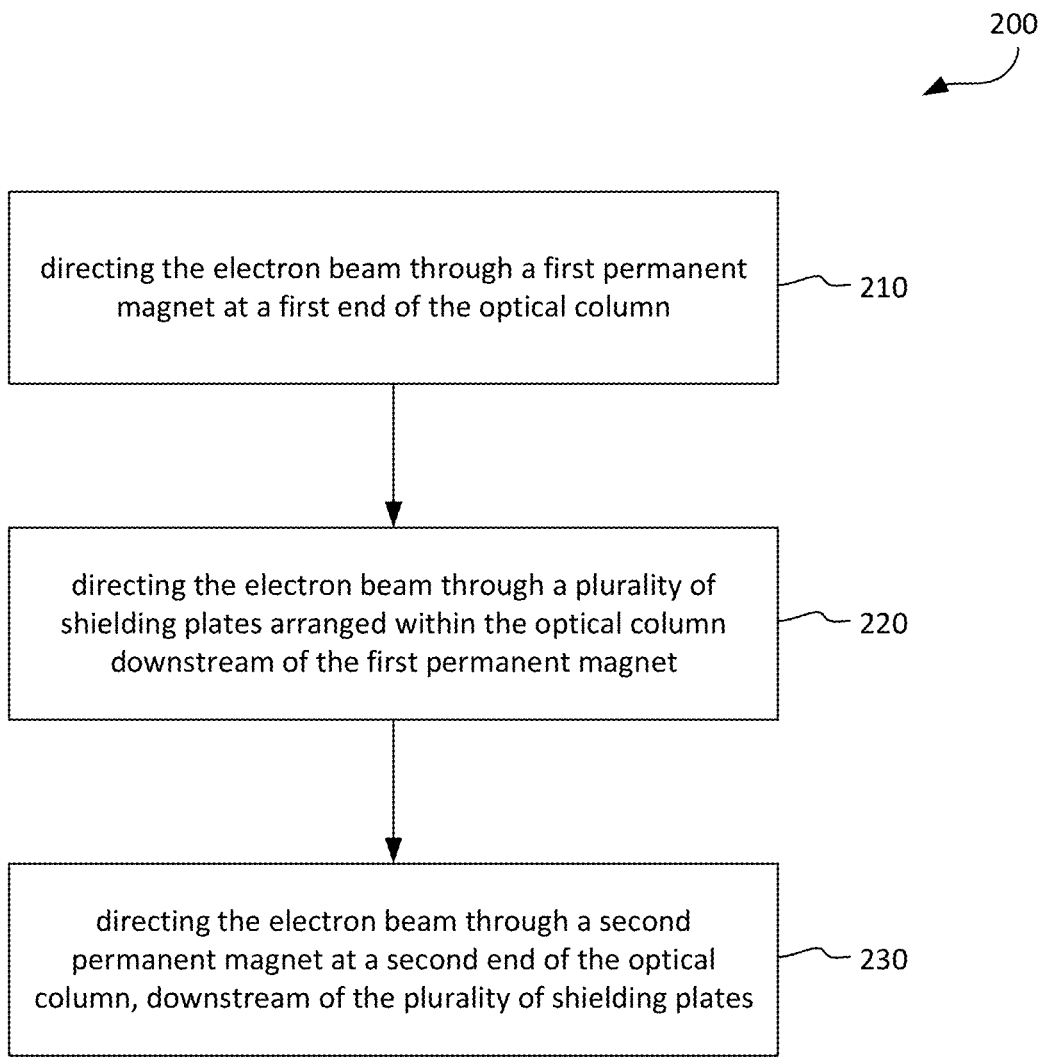
FIG. 5 is a block diagram of a method of the present disclosure.

As shown in FIG. 5, an embodiment of the present disclosure provides a method of stray field mitigation 200. The method 200 may be applied to a multi-column inspection system including an array of electron beam columns. Each electron beam column may comprise an electron beam source configured to emit electrons. The electrons may be directed toward a stage. The stage may be configured to hold a target. The method 200 may comprise the following steps.

At step 210, the electrons from each electron source may be directed through a first permanent magnet array. The first permanent magnet array may condense the electrons into an array of electron beams. The first permanent magnet array be arranged at a first end of the array of electron beam columns. For example, the first permanent magnet array may be arranged at an upper end of the electron beam columns, proximate to the electron beam source.

At step 220, the array of electron beams may be directed through a plurality of shielding plates extending across the array of electron beam columns downstream of the first permanent magnet array. The plurality of shielding plates may each comprise a plurality of apertures. The plurality of apertures may be circular, elliptical, or polygonal. The particular size and shape of each aperture may depend on the position of the particular shielding plate within the array of electron beam columns and/or the size and shape of other components within the array of electron beam columns adjacent to the particular shielding plate. The array of electron beams may pass through the plurality of apertures. In this way, the array of electron beams may pass through each of the plurality of shielding plates as the array of electron beams travels through the array of electron beam columns. Each shielding plate may have a thickness between 1 μm and 1 mm. For example, each shielding plate may have a thickness of at least 120 μm. In a particular embodiment, each shielding plate may have a thickness of about 250 μm. Each shielding plate may have the same or different thickness. The plurality of shielding plates may be comprised of a nickel-iron alloy. For example, the plurality of shielding plates may be comprised of Carpenter 49 or Carpenter HyMu "80" alloy. Other soft iron alloys may be used.

The inspection system of the present disclosure may comprise only one permanent magnet array (e.g., the first permanent magnet array), or the inspection system may comprise more than one permanent magnet array (e.g., the first permanent magnet array and the second permanent magnet array). According to an embodiment of the present disclosure where more than one permanent magnet array are provided, the method 200 may further comprise step 230. At step 230, the array of electron beams may be directed through a second permanent magnet array. The second permanent magnet array may be configured to focus the array of electron beams toward a target on the stage. The second permanent magnet array may be arranged at a second end of the array of electron beam columns, downstream of the plurality of shielding plates. For example, the second permanent magnet may be arranged at a lower end of the array of electron beam columns, proximate to the stage 130.

With the method 200 of the present disclosure, the plurality of shielding plates may reduce stray magnetic field in a radial direction of the array of electron beams. For example, the axial direction of each electron beam column may define the Z-axis, and the X-axis and Y-axis may be defined by the radial directions of each electron beam column. Correspondingly, the magnetic field in each electron beam column may be defined by $B_x$, $B_y$, and $B_z$. The magnetic field $B_x$ and $B_y$ may be reduced to below 7%. Such reduction of magnetic field may result in reduced beam deflection, which improves beam alignment, and improves the accuracy of the inspection process.

According to an embodiment of the present disclosure, step 220 may further comprise the following steps.

At step 221, the array of electron beams may be directed through a first shielding plate. The first shielding plate may be arranged proximate to the first permanent magnet array. For example, the first shielding plate may be arranged at the first end of the array of electron beam columns, downstream of the first permanent magnet array.

At step 229, the array of electron beams may be directed through a second shielding plate. The second shielding plate may be arranged proximate to the second permanent magnet array. For example, the second shielding plate may be arranged at the second end of the array of electron beam columns, upstream of the second permanent magnet array.

According to an embodiment of the present disclosure, the method 200 may further comprise step 224. At step 224 the array of electron beams may be directed through a detector. The detector may be arranged between the first permanent magnet array and the second permanent magnet array. The detector may be configured to detect backscattered electrons reflected off of the target.

According to an embodiment of the present disclosure, step 220 may further comprise step 223. At step 223, the array of electron beams may be directed through a third shielding plate. The third shielding plate may be arranged proximate to the detector. For example, the third shielding plate may be arranged upstream of the detector or downstream of the detector.

According to an embodiment of the present disclosure, step 220 may further comprise step 225. At step 225, the array of electron beams may be directed through a fourth shielding plate. The fourth shielding plate may be arranged proximate to the detector, opposite to the third shielding plate. For example, the third shielding plate may be arranged upstream of the detector, and the fourth shielding plate may be arranged downstream of the detector. Alternatively, the third shielding plate may be arranged downstream of the detector, and the fourth shielding plate may be arranged upstream of the detector. In both configurations, the third shielding plate and the fourth shielding plate may be arranged on opposite sides of the detector.

According to an embodiment of the present disclosure, step 220 may further comprise step 226. At step 226, the array of electron beams may be directed through at least one supplemental shielding plate. The at least one supplemental shielding plate may be arranged between the first shielding plate and the second shielding plate.

Figure 6:
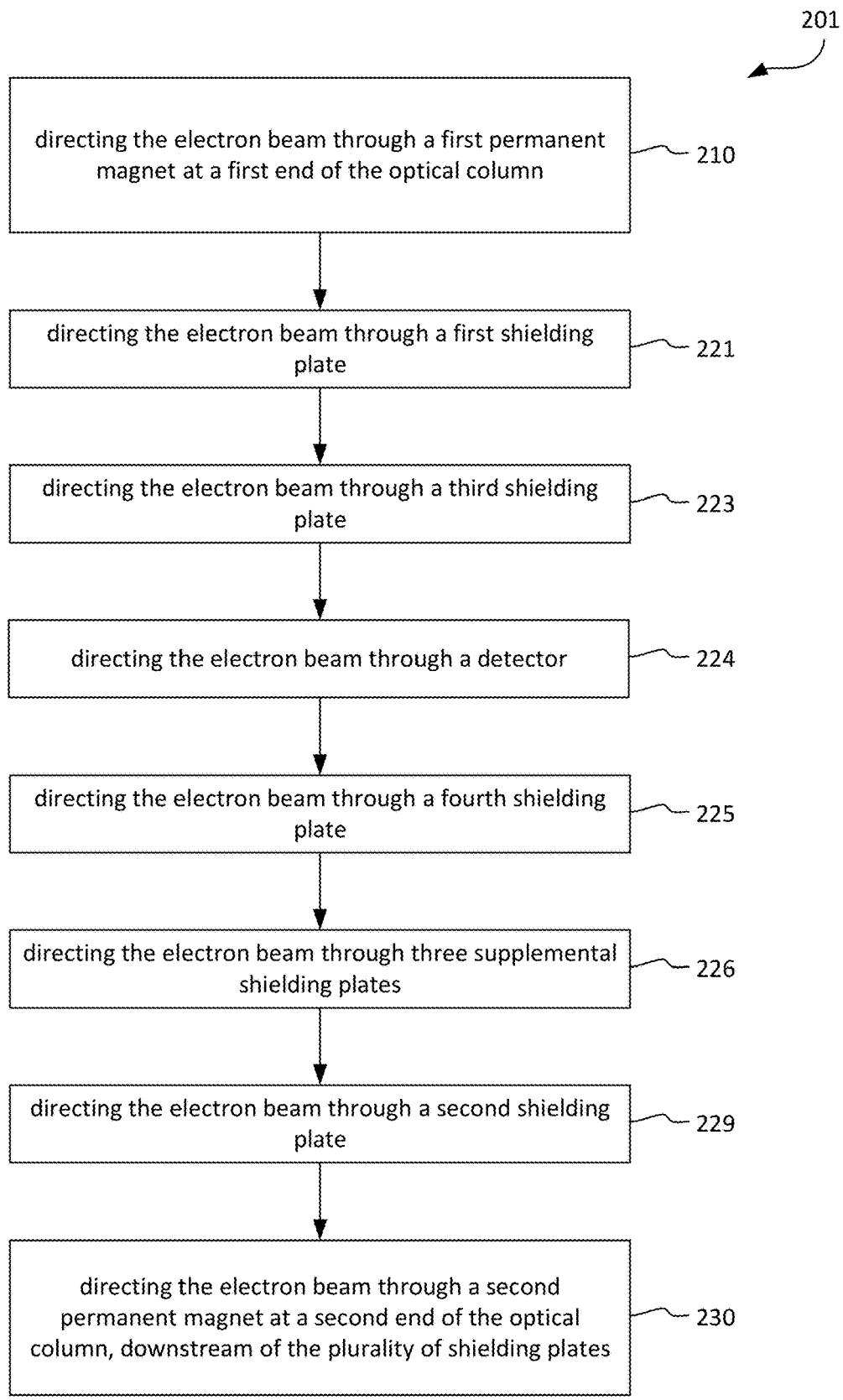
FIG. 6 is a block diagram of a method according to an embodiment of the present disclosure.

According to an embodiment of the present disclosure, the plurality of shielding plates may comprise seven shielding plates. For example, the plurality of shielding plates may comprise the first shielding plate, the second shielding plate, the third shielding plate, the fourth shielding plate, and three supplemental shielding plates. The first shielding plate may be arranged proximate to the first permanent magnet array. The second shielding plate may be arranged proximate to the second permanent magnet array. The third shielding plate and the fourth shielding plate may be arranged proximate to, and on opposite sides of, the detector. A first supplemental shielding plate may be arranged between the first shielding plate and the third shielding plate. A second supplemental shielding plate may be arranged between the fourth shielding plate and the second shielding plate. A third supplemental shielding plate may be arranged between the second supplemental shielding plate and the second shielding plate. Thus, the method 201 may be performed in the following ordered steps, as shown in FIG. 6: step 210, step 221, step 223, step 224, step 225, step 226, step 229, and step 230. According to this design, stray magnetic field in the radial direction may be reduced by more than 92%.

Figure 7:
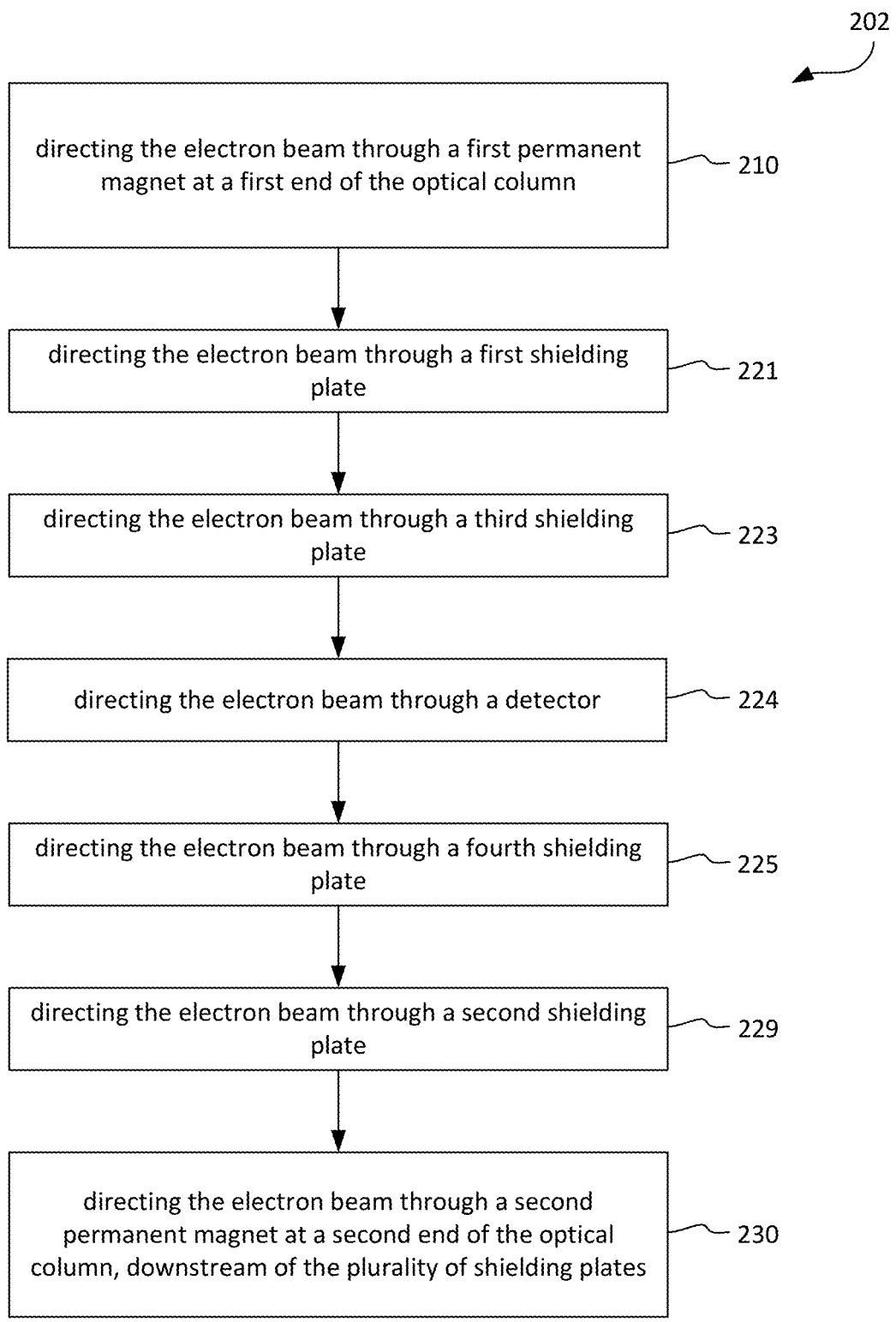
FIG. 7 is a block diagram of a method according to another embodiment of the present disclosure.

According to an embodiment of the present disclosure, the plurality of shielding plates may comprise four shielding plates. For example, the plurality of shielding plates may comprise the first shielding plate, the second shielding plate, the third shielding plate, and the fourth shielding plate. The first shielding plate may be arranged proximate to the first permanent magnet. The second shielding plate may be arranged proximate to the second permanent magnet. The third shielding plate may be arranged proximate to the detector. Thus, the method 202 may be performed in the following ordered steps, as shown in FIG. 7: step 210, step 221, step 223, step 224, step 225, step 229, and step 230. According to this design, stray magnetic field in the radial direction may be reduced by more than 90%.

Figure 8:
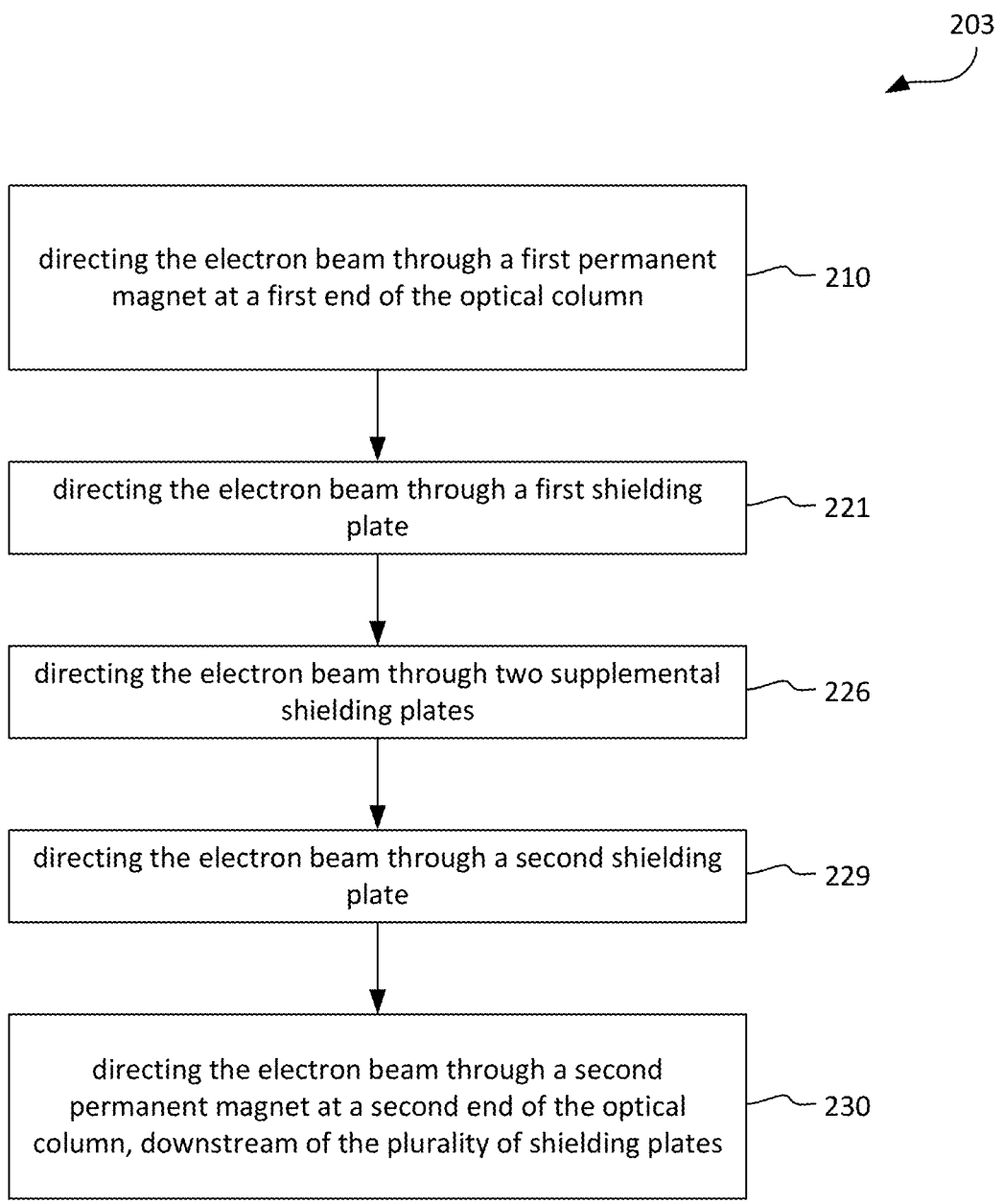
FIG. 8 is a block diagram of a method according to another embodiment of the present disclosure.

According to an embodiment of the present disclosure, the plurality of shielding plates may comprise four shielding plates. For example, the plurality of shielding plates may comprise the first shielding plate, the second shielding plate, the first supplemental shielding plate, and the second supplemental shielding plate. The first shielding plate may be arranged proximate to the first permanent magnet. The second shielding plate may be arranged proximate to the second permanent magnet. The first supplemental shielding plate 165a and the second supplemental shielding plate 165b may be arranged where the stray magnetic field is at a highest magnitude in the radial direction of the array of electron beams 101. For example, referring to FIGS. 2A and 2B, the first supplemental shielding plate 165a and the second supplemental shielding plate 165b may be arranged along the Z-axis where $B_x$ and $B_y$ are at a highest magnitude (positive or negative value). Thus, the method 203 may be performed in the following ordered steps, as shown in FIG. 8: step 210, step 221, step 226, step 229, and step 230. According to this design, stray magnetic field in the radial direction may be reduced by more than 75%.

Figure 9:
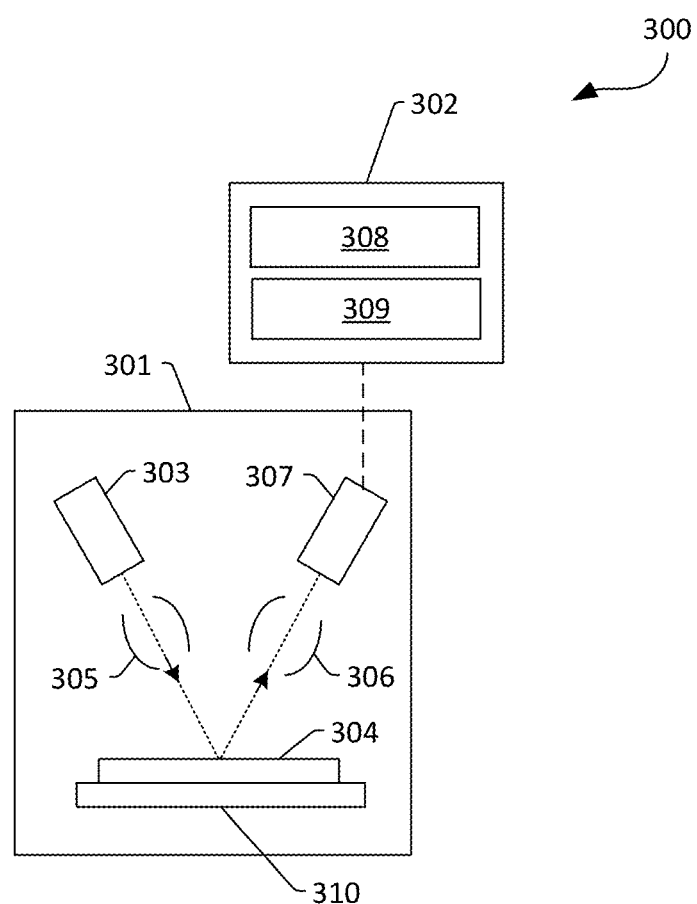
FIG. 9 is a schematic diagram of a system according to an embodiment of the present disclosure.

FIG. 9 is a block diagram of an embodiment of a system 300. The system 300 includes a wafer inspection tool (which includes the electron column 301) configured to generate images of a wafer 304.

The wafer or mask inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 9, the output acquisition subsystem includes electron column 301, which is coupled to computer subsystem 302. A stage 310 may hold the wafer 304.

As also shown in FIG. 9, the electron column 301 includes an electron beam source 303 configured to generate electrons that are focused to wafer 304 by one or more elements 305. The electron beam source 303 may include, for example, a cathode source or emitter tip. The one or more elements 305 may include, for example, a gun lens, an anode, a beam limiting aperture, a gate valve, a beam current selection aperture, an objective lens, and a scanning subsystem, all of which may include any such suitable elements known in the art. The one or more elements 305 may further include a plurality of shielding plates 160, which may reduce stray magnetic field in the electron column 301.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column 301 also may include any other suitable elements known in the art.

Although the electron column 301 is shown in FIG. 9 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 as described above. The detector 307 may detect electrons returned from the surface of the wafer 304 thereby forming electron beam images of the wafer 304. The electron beam images may include any suitable electron beam images. Computer subsystem 302 may be configured to perform any of the functions described herein using the output of the detector 307 and/or the electron beam images. Computer subsystem 302 may be configured to perform any additional step(s) described herein. A system 300 that includes the output acquisition subsystem shown in FIG. 9 may be further configured as described herein.

It is noted that FIG. 9 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 9 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 302 includes a processor 308 and an electronic data storage unit 309. The processor 308 may include a microprocessor, a microcontroller, or other devices.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The processor 308 is in electronic communication with the wafer inspection tool, such as the detector 307. The processor 308 may be configured to process images generated using measurements from the detector 307. For example, the processor may perform embodiments of the method 200.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit.

Multiple processors 308 or electronic data storage units 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

If the system 300 includes more than one computer subsystem 302, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured to perform a number of functions using the output of the system 300 or other output. For instance, the processor 308 may be configured to send the output to an electronic data storage unit 309 or another storage medium. The processor 308 may be further configured as described herein.

The processor 308 or computer subsystem 302 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 308 may be configured according to any of the embodiments described herein. The processor 308 also may be configured to perform other functions or additional steps using the output of the system 300 or using images or data from other sources.

The processor 308 may be communicatively coupled to any of the various components or sub-systems of system 300 in any manner known in the art. Moreover, the processor 308 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 308 and other subsystems of the system 300 or systems external to system 300.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 308 (or computer subsystem 302) or, alternatively, multiple processors 308 (or multiple computer subsystems 302). Moreover, different sub-systems of the system 300 may include one or more computing or logic systems. Therefore, the above description should not be interpreted as a limitation on the present disclosure but merely an illustration.

In an instance, the electron beam columns 101 are incorporated into the electron column 301 or otherwise in the system 300. Various components of the system 300 may be duplicated or otherwise adapted to use the electron beam columns.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An inspection system comprising:
an array of electron beam columns, each comprising an electron source configured to emit electrons toward a stage;
a first permanent magnet array configured to condense the electrons from each electron source into an array of electron beams, wherein the first permanent magnet array is arranged at a first end of the array of electron beam columns; and
a plurality of shielding plates extending across the array of electron beam columns downstream of the first permanent magnet array in a direction of electron emission;
wherein the plurality of shielding plates each comprise a plurality of apertures and have a thickness between 1 μm and 1 mm, and the array of electron beams pass through the plurality of apertures; and
whereby the plurality of shielding plates reduce stray magnetic field in a radial direction of the array of electron beams.

2. The inspection system of claim 1, further comprising:
a second permanent magnet array configured to focus the array of electron beams toward a target on the stage, wherein the second permanent magnet array is arranged at a second end of the array of electron beam columns.

3. The inspection system of claim 2, wherein the plurality of shielding plates comprises:
a first shielding plate arranged proximate to the first permanent magnet array; and
a second shielding plate arranged proximate to the second permanent magnet array.

4. The inspection system of claim 3, further comprising:
a detector configured to detect electrons reflected from the target, wherein the detector is arranged between the first permanent magnet array and the second permanent magnet array; and
wherein the plurality of shielding plates further comprises:
a third shielding plate arranged proximate to the detector.

5. The inspection system of claim 4, wherein the plurality of shielding plates further comprises:
a fourth shielding plate arranged proximate to the detector, opposite to the third shielding plate.

6. The inspection system of claim 5, wherein the plurality of shielding plates further comprises:
at least one supplemental shielding plate arranged between the first shielding plate and the second shielding plate.

7. The inspection system of claim 1, wherein the plurality of shielding plates comprises at least seven shielding plates.

8. The inspection system of claim 1, wherein at least one of the plurality of shielding plates is arranged where the stray magnetic field is at a highest magnitude in the radial direction of the array of electron beams.

9. The inspection system of claim 1, wherein the thickness of each of the plurality of shielding plates is at least 120 μm.

10. The inspection system of claim 1, wherein the plurality of shielding plates are comprised of a magnetic nickel-iron alloy.

11. A method of stray field mitigation applied to a multi-column inspection system including an array of electron beam columns, each electron beam column comprising an electron beam source configured to emit electrons toward a stage, the method comprising:
directing the electrons from each electron source through a first permanent magnet array to condense the electrons into an array of electron beams, wherein the first permanent magnet array is arranged at a first end of the array of electron beam columns; and
directing the array of electron beams through a plurality of shielding plates extending across the array of electron beam columns downstream of the first permanent magnet array;
wherein the plurality of shielding plates each comprise a plurality of apertures and have a thickness between 1 μm and 1 mm, and the array of electron beams pass through the plurality of apertures; and
whereby the plurality of shielding plates reduce stray magnetic field in a radial direction of the array of electron beams.

12. The method of claim 11, further comprising:
directing the array of electron beams through a second permanent magnet array to focus the array of electron beams toward a target on the stage, wherein the second permanent magnet array is arranged at a second end of the array of electron beam columns, downstream of the plurality of shielding plates.

13. The method of claim 12, wherein directing the array of electron beams through a plurality of shielding plates comprises:
directing the array of electron beams through a first shielding plate arranged proximate to the first permanent magnet array; and
directing the array of electron beams through a second shielding plate arranged proximate to the second permanent magnet array.

14. The method of claim 13, further comprising:

directing the array of electron beams through a detector configured to detect electrons reflected from the target, wherein the detector is arranged between the first permanent magnet array and the second permanent magnet array; and wherein directing the array of electron beams through a plurality of shielding plates further comprises:

directing the array of electron beams through a third shielding plate arranged proximate to the detector.

15. The method of claim 14, wherein directing the array of electron beams through a plurality of shielding plates further comprises:

directing the array of electron beams through a fourth shielding plate arranged proximate to the detector, opposite to the third shielding plate.

16. The method of claim 15, wherein directing the array of electron beams through a plurality of shielding plates further comprises:

directing the array of electron beams through at least one supplemental shielding plate arranged between the first shielding plate and the second shielding plate.

17. The method of claim 11, wherein the plurality of shielding plates comprises at least seven shielding plates.

18. The method of claim 11, wherein at least one of the plurality of shielding plates is arranged where the stray magnetic field is at a highest magnitude in the radial direction of the array of electron beams.

19. The method of claim 11, wherein the thickness of each of the plurality of shielding plates is at least 120 μm.

20. The method of claim 11, wherein the plurality of shielding plates are comprised of a magnetic nickel-iron alloy.

* * * * *